(12) United States Patent
Lee

(10) Patent No.: US 8,427,211 B2
(45) Date of Patent: Apr. 23, 2013

(54) CLOCK GENERATION CIRCUIT AND DELAY LOCKED LOOP USING THE SAME

(75) Inventor: Hye Young Lee, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 125 days.

(21) Appl. No.: 12/963,133

(22) Filed: Dec. 8, 2010

(65) Prior Publication Data

US 2011/0291718 A1    Dec. 1, 2011

(30) Foreign Application Priority Data

May 31, 2010 (KR) .......................... 10-2010-0051351

(51) Int. Cl.
    *H03L 7/06* (2006.01)
(52) U.S. Cl.
    USPC .......................................... 327/158; 327/149
(58) Field of Classification Search .................. 327/147, 327/158
    See application file for complete search history.

(56) References Cited

U.S. PATENT DOCUMENTS

| | | | |
|---|---|---|---|
| 5,668,830 A | 9/1997 | Georgiou et al. | |
| 6,437,619 B2 * | 8/2002 | Okuda et al. | 327/158 |
| 7,282,973 B1 * | 10/2007 | Charagulla et al. | 327/158 |
| 2003/0151433 A1 | 8/2003 | Takai | |
| 2004/0012420 A1 * | 1/2004 | Roy et al. | 327/149 |
| 2005/0073344 A1 * | 4/2005 | Furuya | 327/158 |
| 2005/0206419 A1 * | 9/2005 | Kizer et al. | 327/158 |
| 2009/0039931 A1 * | 2/2009 | Demone | 327/158 |
| 2009/0115467 A1 | 5/2009 | Kwon et al. | |
| 2010/0164566 A1 * | 7/2010 | Ku | 327/149 |
| 2010/0225370 A1 * | 9/2010 | Demone | 327/158 |
| 2010/0271087 A1 * | 10/2010 | Choi | 327/149 |
| 2011/0109357 A1 * | 5/2011 | Kim | 327/158 |
| 2011/0291718 A1 * | 12/2011 | Lee | 327/158 |
| 2011/0298509 A1 * | 12/2011 | Khoury et al. | 327/158 |
| 2012/0092051 A1 * | 4/2012 | Erdogan | 327/158 |
| 2012/0119804 A1 * | 5/2012 | Ma | 327/158 |
| 2012/0169388 A1 * | 7/2012 | Ma | 327/158 |
| 2012/0200325 A1 * | 8/2012 | Werner | 327/156 |
| 2012/0206176 A1 * | 8/2012 | Hwang et al. | 327/156 |

FOREIGN PATENT DOCUMENTS

| | | |
|---|---|---|
| JP | 06-061849 A | 4/1994 |
| JP | 2000-341099 | 12/2000 |
| JP | 2002-290214 A | 4/2002 |
| JP | 2009-177778 A | 8/2009 |
| KR | 10-20000050584 A | 8/2000 |

\* cited by examiner

*Primary Examiner* — Adam Houston
(74) *Attorney, Agent, or Firm* — William Park & Associates Ltd.

(57) ABSTRACT

A clock generation circuit includes a plurality of variable delay units configured to control a delay of an input clock signal under the control of delay control signals assigned thereto among a plurality of delay control signals, and output a plurality of delayed clock signals; a phase comparison unit configured to compare a phase of a reference clock signal which has a predetermined phase difference from the input clock signal and a phase of a delayed clock signal which is outputted from any one variable delay unit among the plurality of variable delay units; and a delay control unit configured to generate the plurality of delay control signals based on a comparison result from the phase comparison unit.

22 Claims, 7 Drawing Sheets

(a)Delayed clock generation part (b)Delay lock loop part - Before locking (c)Delay lock loop part - After locking (a) Delayed clock generation – Upon initialization (b) Delayed clock generation – After locking

CLOCK GENERATION CIRCUIT AND DELAY LOCKED LOOP USING THE SAME

CROSS-REFERENCES TO RELATED APPLICATION

The present application claims priority under 35 U.S.C. §119(a) to Korean Application No. 10-2010-0051351, filed on May 31, 2010, in the Korean Intellectual Property Office, which is incorporated herein by reference in its entirety as if set forth in full.

BACKGROUND

1. Technical Field

The present invention relates to a semiconductor apparatus, and more particularly, to technologies for configuring a clock generation circuit and a delay locked loop.

2. Related Art

A semiconductor apparatus operates in synchronization with a periodic pulse signal such as a clock signal in order to increase an operation speed and ensure efficient internal operations. Most semiconductor apparatuses use externally supplied clock signals or internally generated clock signals dependent on the occasion.

An external clock signal inputted to a semiconductor apparatus becomes delayed inside the semiconductor apparatus, and thus in cases where data is outputted using a delayed clock signal, the outputted data is not synchronized with the external clock signal, which is problematic. Therefore, the semiconductor apparatus compensates for difference in timing between the external clock signal and the internal clock signal by using a delay locked loop (DLL) or a phase locked loop (PLL).

As frequencies of external clock signals gradually increase to accommodate high speed operations, it becomes increasingly difficult to generate internal clock signals with desirable phases.

SUMMARY

In one aspect of the present invention, a clock generation circuit includes: a plurality of variable delay units, each unit configured to control a delay of an input clock signal under the control of a delay control signal assigned thereto among a plurality of delay control signals, and output a plurality of delayed clock signals; a phase comparison unit configured to compare a phase of a is reference clock signal having a predetermined phase difference from the input clock signal and a phase of a delayed clock signal outputted from any one variable delay unit among the plurality of variable delay units; and a delay control unit configured to generate the plurality of delay control signals based on a comparison result from the phase comparison unit.

In another aspect of the present invention, a clock generation circuit includes: a plurality of variable delay units configured to control a delay of an input clock signal according to a voltage level of a common delay control signal, and output a plurality of delayed clock signals; a phase comparison unit configured to compare a reference clock signal having a predetermined phase difference from the input clock signal and a phase of a delayed clock signal which is outputted from any one variable delay unit among the plurality of variable delay units; and a common delay control unit configured to output the common delay control signal which is controlled in the voltage level thereof according to a comparison result from the phase comparison unit, wherein the plurality of variable delay units have different variable delays in correspondence to a change in the voltage level of the common delay control signal.

In another aspect of the present invention, a delay locked loop includes: a plurality of variable delay units, each unit configured to control a delay of an input clock signal under the control of delay control signals assigned thereto among a plurality of delay control signals, and output a plurality of delayed clock signals; a first phase is comparison unit configured to compare a phase of a reference clock signal having a predetermined phase difference from the input clock signal and a phase of a delayed clock signal which is outputted from any one variable delay unit among the plurality of variable delay units; a delay control unit configured to generate the plurality of delay control signals based on a comparison result from the first phase comparison unit; a second phase comparison unit configured to compare phases of the input clock signal and a feedback clock signal and output a phase detection signal; a phase control unit configured to output clock select signals and a phase mixing signal under the control of the phase detection signal; a selection unit configured to output first and second delayed control signals which are selected from the plurality of delayed clock signals by the clock select signals; a phase mixing unit, under the control of the phase mixing signal, configured to mix phases of the first and second delayed clock signals, which are outputted from the selection unit, and output an output clock signal; and a delay modeling unit configured to delay the output clock signal by a model delay of a clock transfer path and output the feedback clock signal.

In another aspect of the present invention, a delay locked loop includes: a plurality of variable delay units configured to control a delay of an input clock signal according to a voltage level of a common delay control signal, and output a plurality of delayed clock signals; a first phase comparison unit configured to compare a phase of a reference clock signal having a predetermined phase difference from the input clock signal and a phase of a delayed clock signal which is outputted from any one variable delay unit among the plurality of variable delay units; a common delay control unit configured to output the common delay control signal which is controlled in the voltage level thereof according to a comparison result from the first phase comparison unit; a second phase comparison unit configured to compare phases of the input clock signal and a feedback clock signal and output a phase detection signal; a phase control unit configured to output clock select signals and a phase mixing signal under the control of the phase detection signal; a selection unit configured to output first and second delayed control signals which are selected from the plurality of delayed clock signals by the clock select signals; a phase mixing unit configured to mix phases of the first and second delayed clock signals, which are outputted from the selection unit, under the control of the phase mixing signal, and output an output clock signal; and a delay modeling unit configured to delay the output clock signal by a model delay of a clock transfer path and output the feedback clock signal, wherein the plurality of variable delay units have different variable delays in correspondence to a change in the voltage level of the common delay control signal.

BRIEF DESCRIPTION OF THE DRAWINGS

Features, aspects, and embodiments are described in conjunction with the attached drawings, in which.

DETAILED DESCRIPTION

Hereinafter, a clock generation circuit and a delay locked loop using the same according to the present invention will be described below with reference to the accompanying drawings through exemplary embodiments.

For reference, since terms, symbols and signs that are used in drawings and in this detailed description to designate devices, blocks, and so on may be used for detailed units as the occasion demands, it is to be noted that the same terms, symbols and signs may not designate the same devices, blocks, and so on in an entire circuitry. In general, the logic signals of a circuit and binary data values are divided into a high level (H) and a low level (L) in correspondence to voltage levels and may be represented as '1' and '0'. Furthermore, as the occasion demands, a high impedance state (a high-Z state) may be defined and described.

Figure 1:
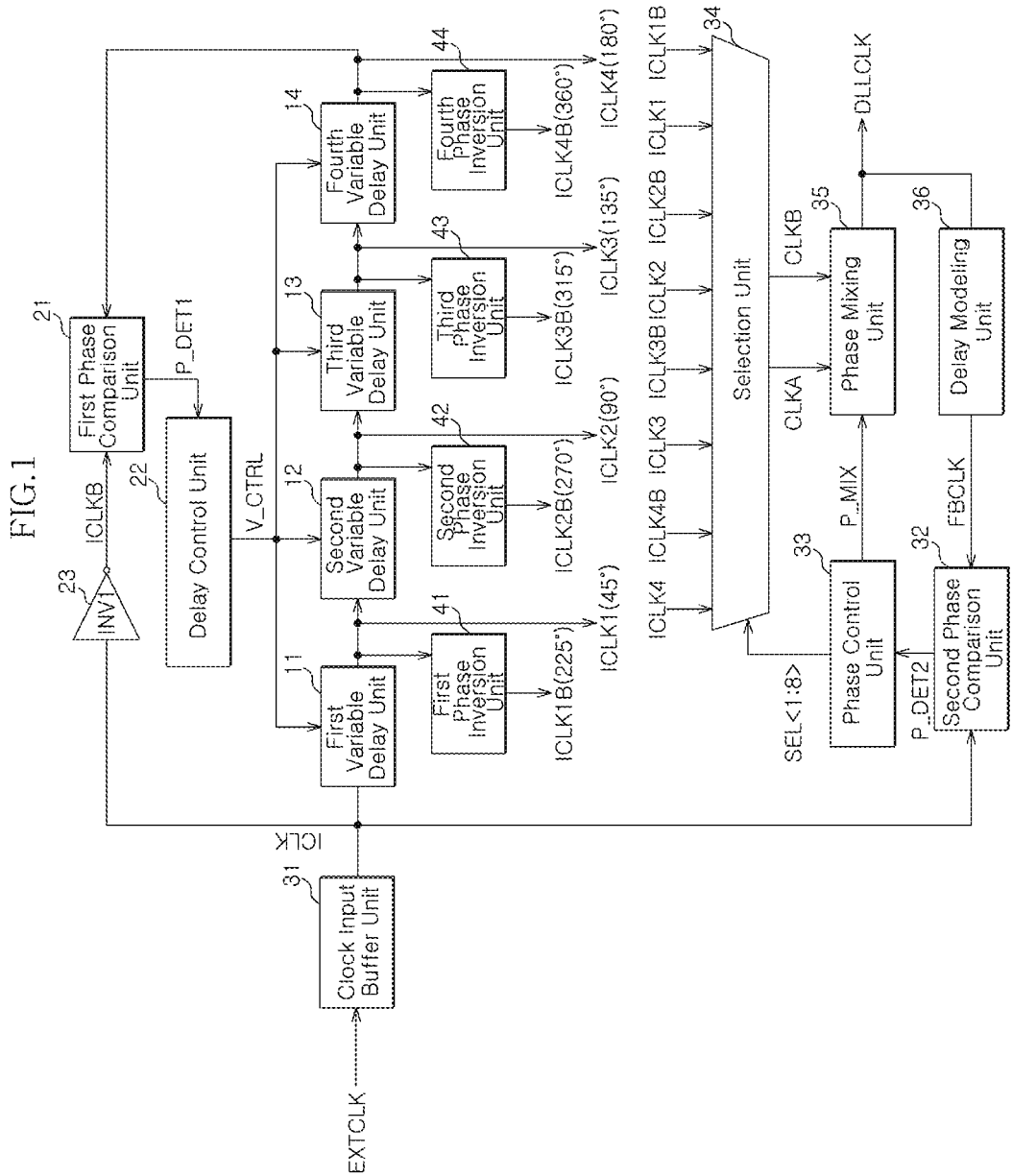
FIG. 1 is a configuration diagram illustrating an exemplary delay locked loop in accordance with a first embodiment of the present invention.

FIG. 1 is a configuration diagram illustrating an exemplary delay locked loop in accordance with a first embodiment of the present invention.

Referring to FIG. 1, a delay locked loop includes a plurality of variable delay units 11, 12, 13 and 14, a first phase comparison unit 21, a delay control unit 22, an inverter 23, phase inversion units 41, 42, 43 and 44, a clock input buffer unit 31, a second phase comparison unit 32, a phase control unit 33, a selection unit 34, a phase mixing unit 35, and a delay modeling unit 36.

The inverter 23 is configured to invert an input clock signal ICLK and output a reference clock signal ICLKB. The reference clock signal ICLKB is set as a signal which has a phase difference of one half cycle from the input clock signal ICLK.

The first phase comparison unit 21 is configured to compare the phase of the reference clock signal ICLKB and the phase of a delayed clock signal ICLK4 which is outputted from any one variable delay unit among variable delay units 11, 12, 13 and 14. In the present embodiment, the first phase comparison unit 21 compares the phase of the delayed clock signal ICLK4 outputted from a fourth variable delay unit 14 and the phase of the reference clock signal ICLKB, and outputs a first phase detection signal P_DET1. The first phase detection signal P_DET1 can be defined as a signal which has a voltage level or a pulse width corresponding to a phase difference between the two clock signals. In the present embodiment, the first phase comparison unit 21 locks the first phase detection signal P_DET1 when the phases of the delayed clock signal ICLK4 and the reference clock signal ICLKB become equal.

The delay control unit 22 is configured to output a delay control signal V_CTRL, the voltage level whereof is controlled by a comparison result from the first comparison unit 21, that is, the first phase detection signal P_DET1. In general, the delay control unit 22 can include a plurality of voltage dropping elements and a plurality of switching elements. The delay control unit 22 outputs any one divided voltage among a plurality of divided voltages, as the delay control signal V_CTRL under the control of the first phase detection signal P_DET1.

The plurality of variable delay units 11, 12, 13 and 14 are coupled in series and their delays are controlled by the delay control signal V_CTRL. The first variable delay unit 11 is configured to delay the input clock signal ICLK and output a first delayed clock signal ICLK1. The second variable delay unit 12 is configured to delay the first delayed clock signal ICLK1 and output a second delayed clock signal ICLK2. The third variable delay unit 13 is configured to delay the second delayed clock signal ICLK2 and output a third delayed clock signal ICLK3. The fourth variable delay unit 14 is configured to delay the third delayed clock signal ICLK3 and output the fourth delayed clock signal ICLK4.

The delays of the plurality of variable delay units 11, 12, 13 and 14 are controlled according to the voltage level of the delay control signal V_CTRL. The delays of the plurality of variable delay units 11, 12, 13 and 14 increase as the voltage level of the delay control signal V_CTRL decreases, and decrease as the voltage level of the delay control signal V_CTRL increases. In the present embodiment, since the plurality of variable delay units 11, 12, 13 and 14 are composed of the same elements, they have the same delay under the control of the delay control signal V_CTRL.

In the present embodiment, when the phases of the fourth delayed clock signal ICLK4 outputted from the fourth variable delay unit 14 and the reference clock signal ICLKB are equal, the first phase detection signal P_DET1 is locked. Accordingly, considering that the reference clock signal ICLKB is defined as a signal which has a phase difference of one half cycle of the input clock signal ICLK, the fourth delayed clock signal ICLK4 is also defined as a signal which has a phase difference of one half cycle, that is, 180°, from the input clock signal ICLK. The third delayed clock signal ICLK3, which is outputted from the third variable delay unit 13, is defined as a signal which has a phase difference of 135° from the input clock signal ICLK. The second delayed clock signal ICLK2, which is outputted from the second variable delay unit 12, is defined as a signal which has a phase difference of 90° from the input clock signal ICLK. The first delayed clock signal ICLK1, which is outputted from the first variable delay unit 11, is defined as a signal which has a phase difference of 45° from the input clock signal ICLK.

The phase inversion units 41, 42, 43 and 44 output signals ICLK1B, ICLK2B, ICLK3B and ICLK4B which are acquired by inverting the phases of the plurality of delayed clock signals ICLK1, ICLK2, ICLK3, ICLK4 outputted from the plurality of variable delay units 11, 12, 13 and 14. Hence, fifth through eighth delayed clock signals ICLK1B, ICLK2B, ICLK3B and ICLK4B, which respectively have phase differences of 225°, 270°, 315° and 360° from the input clock signal ICLK, are additionally generated.

The clock input buffer unit 31 is configured to buffer an external clock signal EXTCLK and output the input clock signal ICLK.

The second phase comparison unit 32 is configured to compare the phases of the input clock signal ICLK and a feedback clock signal FBCLK and output a second phase detection signal P_DET2. That is to say, the second phase comparison unit 32 locks the second phase detection signal P_DET2 when the phases of the input clock signal ICLK and the feedback clock signal FBCLK are equal. The second phase detection signal P_DET2 can be defined as a signal which has a voltage level or a pulse width corresponding to a phase is difference between the two clock signals.

The phase control unit 33 is configured to output clock select signals SEL<1:8> and a phase mixing signal P_MIX under the control of the second phase detection signal P_DET2.

The selection unit 34 is configured to output two delayed clock signals CLKA and CLKB which are selected from the plurality of delayed clock signals ICLK1, ICLK2, ICLK3, ICLK4, ICLK1B, ICLK2B, ICLK3B and ICLK4B by the clock select signals SEL<1:8>.

The phase mixing unit 35 is configured to mix the phases of the two delayed clock signals CLKA and CLKB, which are outputted from the selection unit 34, under the control of the phase mixing signal P_MIX and output an output clock signal DLLCLK. The phase mixing unit 35 may be configured to control the phase weights of the two delayed clock signals CLKA and CLKB under the control of the phase mixing signal P_MIX. In general, the phase weights of the two delayed clock signals CLKA and CLKB are designed to be the same with each other.

The delay modeling unit 36 is configured to delay the output clock signal DLLCLK by the model delay of a clock transfer path and output the feedback clock signal FBCLK. For reference, the model delay is determined by modeling the delay of the clock input buffer unit 31, the delay of a signal line through which the output clock signal DLLCLK is transferred internally, and the delays of a repeater, etc.

The delay locked loop in accordance with the present is embodiment of the invention can generate the output clock signal DLLCLK by selectively using the plurality of delayed clock signals ICLK1, ICLK2, ICLK3, ICLK4, ICLK1B, ICLK2B, ICLK3B and ICLK4B which have various phases.

In the delay locked loop configured as mentioned above, the plurality of variable delay units 11, 12, 13 and 14 are arranged in series. Therefore, the default delays, that is, the gate delays, of the respective variable delay units accumulate and are reflected on the delayed clock signals.

Figure 2:
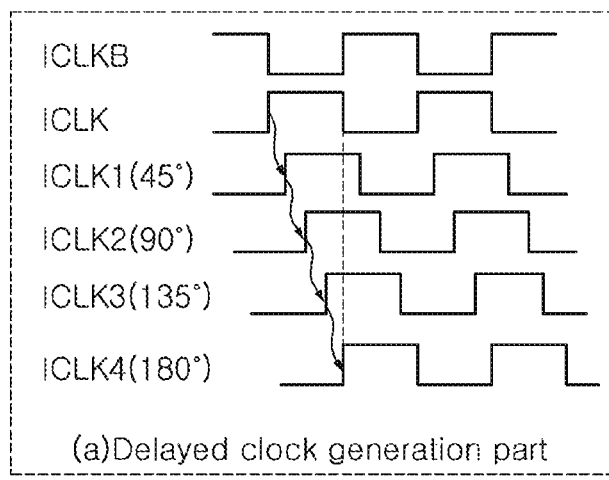
FIG. 2 is a timing diagram illustrating the operations of the delay locked loop shown in FIG. 1.
Figure 2:
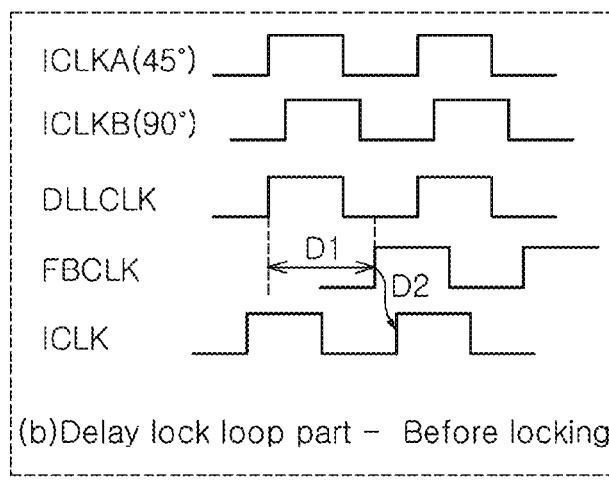
Figure 2:
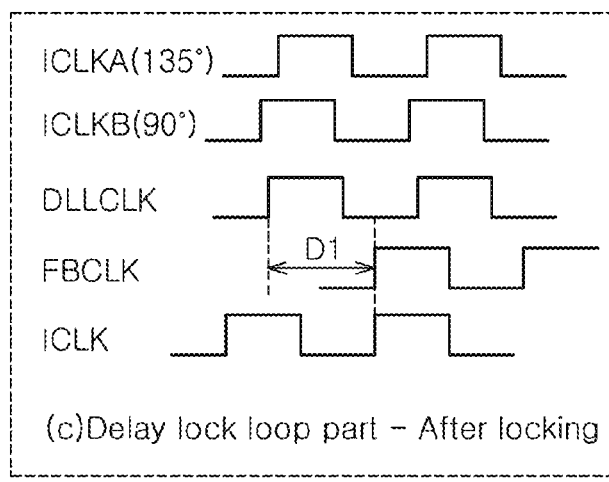

FIG. 2 is a timing diagram illustrating the operations of the delay locked loop shown in FIG. 1.

The operations of the delay locked loop configured as mentioned above will be described with reference to the timing diagram of FIG. 2.

First, referring to the timing diagram for the operation (a) for generating the delayed clock signals, the fourth delayed clock signal ICLK4 is outputted to have the same phase as the reference clock signal ICLKB, that is, to have the phase difference of 180° from the input clock signal ICLK. The third delayed clock signal ICLK3 is outputted to have the phase difference of 135° from the input clock signal ICLK. The second delayed clock signal ICLK2 is outputted to have the phase difference of 90° from the input clock signal ICLK. The first delayed clock signal ICLK1 is outputted to have the phase difference of 45° from the input clock signal ICLK.

Next, referring to the timing diagram for the operation (b) of the delay locked loop before locking, D1 denotes the delay of the delay modeling unit 36, and D2 denotes a delay additionally needed for locking. Here, two selected delayed clock signals are signals which have the phases of 45° and 90°. However, even though these two delayed clock signals are mixed, the desired delay corresponding to D2 cannot be acquired.

Finally, referring to the timing diagram for the operation (c) of the delay locked loop after locking, two delayed clock signals which are selected through an internal control are signals which have the phases of 135° and 90°. The phase mixing unit 35 of the delay locked loop acquires a delay corresponding to D2 by mixing these two delayed clock signals, and finally outputs the output clock signal DLLCLK which has a desired phase.

Figure 3:
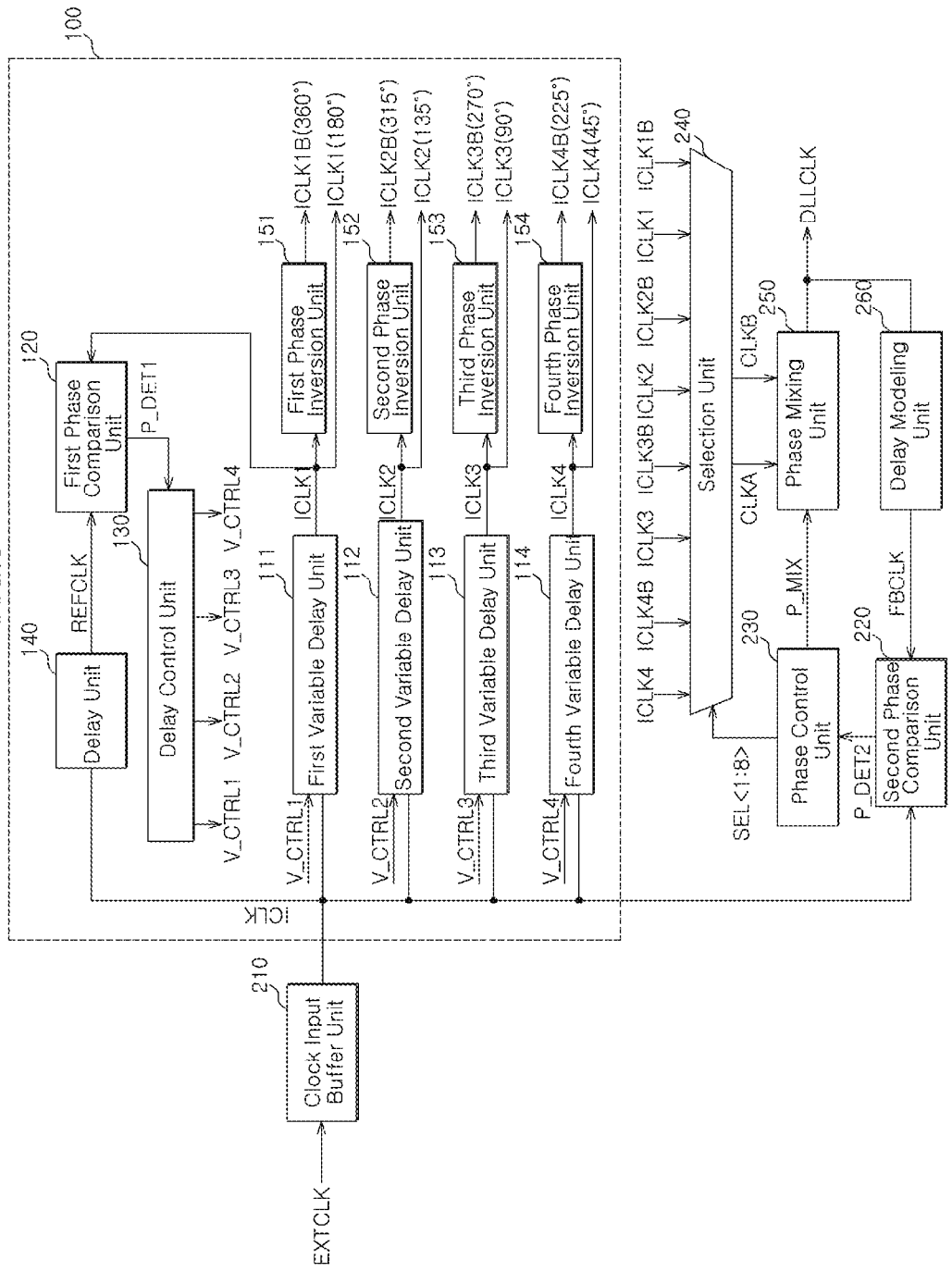
FIG. 3 is a configuration diagram illustrating an exemplary delay locked loop in accordance with a second embodiment of the present invention.

FIG. 3 is a configuration diagram illustrating an exemplary delay locked loop in accordance with a second embodiment of the present invention.

The delay locked loop in accordance with the present embodiment of the invention includes only a simplified configuration for the sake of clear description of the technical concept suggested.

Referring to FIG. 3, a delay locked loop includes a clock generation circuit 100, a clock input buffer unit 210, a second phase comparison unit 220, a phase control unit 230, a selection unit 240, a phase mixing unit 250, and a delay modeling unit 260.

The detailed configuration and principal operations of the delay locked loop configured as mentioned above are described below.

The clock generation circuit 100 includes a plurality of variable delay units 111, 112, 113 and 114, a first phase comparison unit 120, a delay control unit 130, a delay unit 140, and phase inversion units 151, 152, 153 and 154. For reference, the delay unit 140 and the phase inversion units 151, 152, 153 and 154 are component parts which can be selectively provided depending upon an embodiment.

The delay unit 140 is configured to delay an input clock signal ICLK and output a reference clock signal REFCLK. The reference clock signal REFCLK may be set as a signal which has a phase difference of one half cycle from the input clock signal ICLK. Of course, the delay of the delay unit 140 may be designed differently depending upon an embodiment.

The first phase comparison unit 120 is configured to compare the phase of the reference clock signal REFCLK, which has a predetermined phase difference from the input clock signal ICLK, and the phase of a delayed clock signal ICLK1, which is outputted from any one variable delay unit among the plurality of variable delay units 111, 112, 113 and 114. In the present embodiment, the first phase comparison unit 120 compares the phase of the delayed clock signal ICLK1 outputted from the first variable delay unit 111 and the phase of the reference clock signal REFCLK, and outputs a first phase detection signal P_DET1. The first phase detection signal P_DET1 can be defined as a signal which has a voltage level or a pulse width corresponding to a phase difference between the two clock signals. In the present embodiment, the first phase comparison unit 120 locks the first phase detection signal P_DET1 when the phases of the delayed clock signal ICLK1 and the reference clock signal REFCLK become equal. For reference, while the reference clock signal REFCLK can be defined as a signal which is generated by delaying the input clock signal ICLK as described above, it is conceivable depending upon an embodiment that the reference clock signal REFCLK may be defined as a clock signal which is externally supplied.

The delay control unit 130 is configured to output a plurality of delay control signals V_CTRL1, V_CTRL2, V_CTRL3 and V_CTRL4 which have different voltage levels, according to a comparison result from the first phase comparison unit 120. The voltage levels of the plurality of delay control signals V_CTRL1, V_CTRL2, V_CTRL3 and V_CTRL4 have predetermined difference times in multiples. In other words, if the voltage level of the first delay control signal V_CTRL1 is outputted to be lowest, the voltage level of the second delay control signal V_CTRL2 is outputted to be higher by a predetermined multiple of the voltage level of the first delay control signal V_CTRL1. The voltage level of the third delay control signal V_CTRL3 is outputted to be higher by a predetermined multiple of the voltage level of the second delay control signal V_CTRL2. The voltage level of the fourth delay control signal V_CTRL4 is outputted to be higher by the predetermined multiple of the voltage level of the third delay control signal V_CTRL3. Thus, the delay control unit 130 generates the plurality of delay control signals V_CTRL1, V_CTRL2, V_CTRL3 and V_CTRL4 such that the voltage levels of the plurality of delay control signals V_CTRL1, V_CTRL2, V_CTRL3 and V_CTRL4 have a predetermined ratios of multiples. Of course, the delay control unit 130 controls the voltage levels of the plurality of delay control signals V_CTRL1, V_CTRL2, V_CTRL3 and V_CTRL4 under the control of the first phase detection signal P_DET1. Assuming that the pulse width of the first phase detection signal P_DET1 can be controlled, the voltage level of the first delay control signal V_CTRL1 is controlled according to the pulse width of the first phase detection signal P_DET1, and the voltage levels of the remaining delay control signals are controlled according to the predetermined difference between multiples. In general, the delay control unit 130 can include a plurality of voltage dropping elements and a plurality of switching elements. The delay control unit 130 outputs a plurality of divided voltages, which are divided under the control of the first phase detection signal P_DET1, as the plurality of delay control signals V_CTRL1, V_CTRL2, V_CTRL3 and V_CTRL4.

The plurality of variable delay units 111, 112, 113 and 114 are configured to control the delays of the input clock signal ICLK according to the voltage levels of delay control signals which are assigned thereto among the plurality of delay control signals V_CTRL1, V_CTRL2, V_CTRL3 and V_CTRL4, and output a plurality of delayed clock signals ICLK1, ICLK2, ICLK3 and ICLK4. The delays of the plurality of variable delay units 111, 112, 113 and 114 increase as the voltage levels of the delay control signals assigned thereto decrease, and decrease as the voltage levels of the delay control signals assigned thereto increase. The plurality of variable delay units 111, 112, 113 and 114 have the same variable delay in correspondence to a change in the voltage levels of the delay control signals. In the present embodiment, since the plurality of variable delay units 111, 112, 113 and 114 are composed of the same elements, when assuming that the delay control signals having the same voltage level are inputted to the plurality of variable delay units 111, 112, 113 and 114, all the plurality of delayed clock signals ICLK1, ICLK2, ICLK3 and ICLK4, which are outputted from the plurality of variable delay units 111, 112, 113 and 114, have the same phase.

Meanwhile, as described above, the voltage levels of the plurality of delay control signals V_CTRL1, V_CTRL2, V_CTRL3 and V_CTRL4 for controlling the delays of the plurality of variable delay units 111, 112, 113 and 114 are outputted with the predetermined differences between multiples. Accordingly, the plurality of delayed clock signals ICLK1, ICLK2, ICLK3 and ICLK4, which are outputted from the plurality of variable delay units 111, 112, 113 and 114, respectively, have different phases. In the present embodiment, when the phases of the first delayed clock signal ICLK1 outputted from the first variable delay unit 111 and the reference clock signal REFCLK are equal, the first phase detection signal P_DET1 is locked. Accordingly, considering that the reference clock signal REFCLK is defined as a signal which has a phase difference of one half cycle from the input clock signal ICLK, the first delayed clock signal ICLK1 is also defined as a signal which has a phase difference of one half cycle, that is, 180°, from the input clock signal ICLK. The second delayed clock signal ICLK2, which is outputted from the second variable delay unit 112, is defined as a signal which has a phase difference of 135° from the input clock signal ICLK. The third delayed clock signal ICLK3, which is outputted from the third variable delay unit 113, is defined as a signal which has a phase difference of 90° from the input clock signal ICLK. The fourth delayed clock signal ICLK4, which is outputted from the fourth variable delay unit 114, is defined as a signal which has a phase difference of 45° from the input clock signal ICLK.

The phase inversion units 151, 152, 153 and 154 output signals ICLK1B, ICLK2B, ICLK3B and ICLK4B respectively, which are acquired by respectively inverting the phases of the plurality of delayed clock signals ICLK1, ICLK2, ICLK3, ICLK4 outputted respectively from the plurality of variable delay units 111, 112, 113 and 114. Hence, fifth through eighth delayed clock signals ICLK1B, ICLK2B, ICLK3B and ICLK4B, which respectively have phase differences of 360°, 315°, 270° and 225° from the input clock signal ICLK, are additionally generated.

The clock generation circuit 100 in accordance with the present embodiment of the invention can generate the plurality of delayed clock signals ICLK1, ICLK2, ICLK3, ICLK4, ICLK1B, ICLK2B, ICLK3B and ICLK4B which have different phases from the input clock signal ICLK. In the clock generation circuit 100 configured as mentioned above, the plurality of variable delay units 111, 112, 113 and 114 are internally arranged in parallel such that the input clock signal ICLK is delayed by relative delays. When generating each delayed clock signal, in such a scheme in which the plurality of variable delay units 111, 112, 113 and 114 are arranged in parallel, only the default delay of one variable delay unit, that is, the gate delay of the corresponding variable delay unit is reflected on the corresponding delayed clock signal. Therefore, even when the frequency of the input clock signal ICLK increases, the delayed clock signals having desired phases can be generated.

The principal operations of the delay locked loop shown in FIG. 3, which includes the above-described clock generation circuit 100, are described below.

The clock input buffer unit 210 is configured to buffer an external clock signal EXTCLK and output the input clock signal ICLK.

The second phase comparison unit 220 is configured to compare the phases of the input clock signal ICLK and a feedback clock signal FBCLK and output a second phase detection signal P_DET2. That is to say, the second phase comparison unit 220 locks the second phase detection signal P_DET2 when the phases of the input clock signal ICLK and the feedback clock signal FBCLK are equal. The second phase detection signal P_DET2 can be defined as a signal which has a voltage level or a pulse width corresponding to a phase difference between the two clock signals.

The phase control unit 230 is configured to output clock select signals SEL<1:8> and a phase mixing signal P_MIX under the control of the second phase detection signal P_DET2.

The selection unit 240 is configured to output two delayed clock signals CLKA and CLKB which are selected from the plurality of delayed clock signals ICLK1, ICLK2, ICLK3, ICLK4, ICLK1B, ICLK2B, ICLK3B and ICLK4B by the clock select signals SEL<1:8>.

The phase mixing unit 250 is configured to mix the phases of the two delayed clock signals CLKA and CLKB, which are outputted from the selection unit 240, under the control of the phase mixing signal P_MIX and output an output clock signal DLLCLK. The phase mixing unit 250 may be configured to control the phase weights of the two delayed clock signals CLKA and CLKB under the control of the phase mixing signal P_MIX. In general, the phase weights of the two delayed clock signals CLKA and CLKB are designed to be the same with each other.

The delay modeling unit 260 is configured to delay the output clock signal DLLCLK by the model delay of a clock transfer path and output the feedback clock signal FBCLK. For reference, the model delay is determined by modeling the delay of the clock input buffer unit 210, the delay of a signal line through which the output clock signal DLLCLK is transferred internally, and the delays of a repeater, etc.

Figure 4:
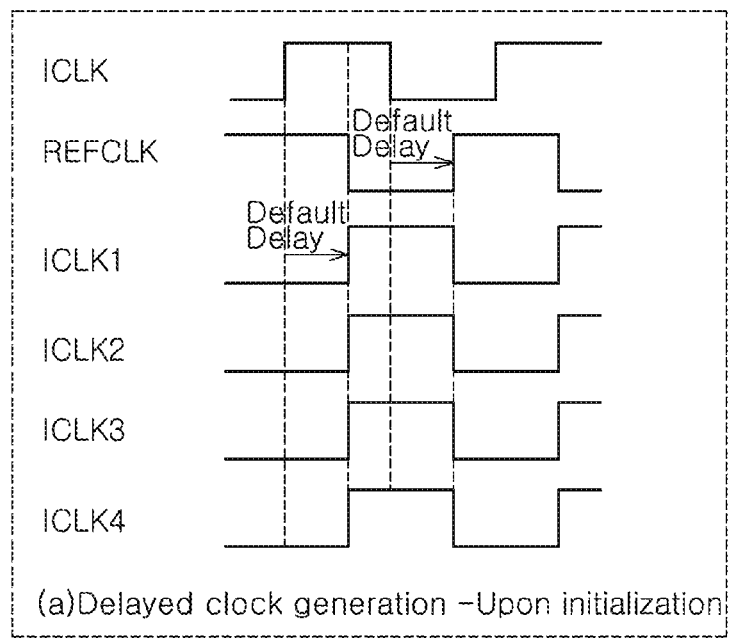
FIG. 4 is a timing diagram illustrating the internal operations of a clock generation circuit of the delay locked loop shown in FIG. 3.
Figure 4:
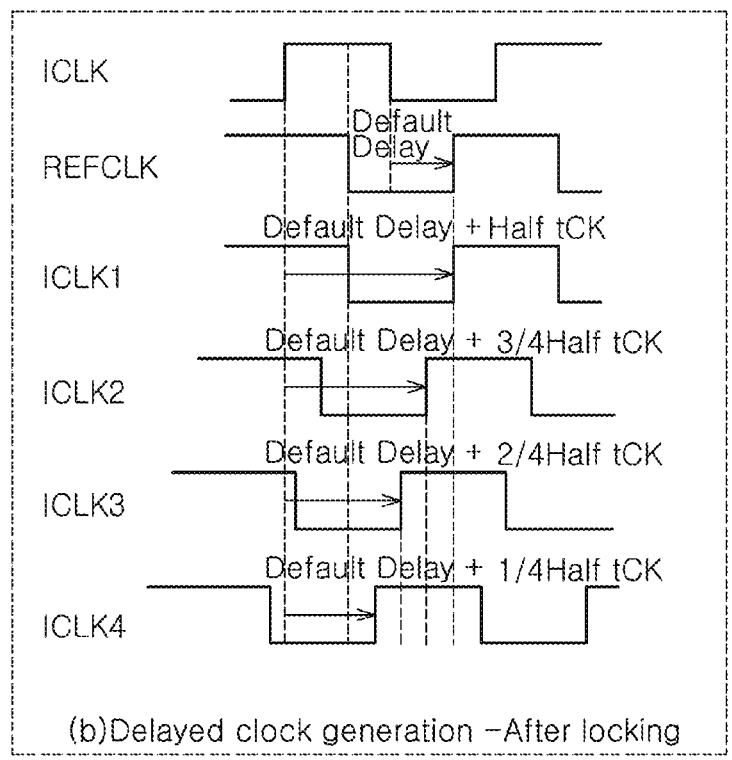

FIG. 4 is a timing diagram illustrating the internal operations of the clock generation circuit 100 of the delay locked loop shown in FIG. 3.

The operations of the clock generation circuit 100 configured as mentioned above are described with reference to the timing diagram of FIG. 4.

The present timing diagram is based on the assumption that the delay of the delay unit 140 is a sum of a default delay and a delay corresponding to one half cycle of the input clock signal ICLK. Accordingly, the reference clock signal REFCLK is defined as a signal which has a phase that is delayed by the one half cycle of the input clock signal ICLK and then by the default delay of a variable delay unit.

First, referring to the timing diagram for an initial operation (a) of the clock generation circuit 100, the reference clock signal REFCLK is outputted to have a phase that is delayed by the delay corresponding to the one half cycle of the input clock signal ICLK and then by the default delay of a variable delay unit. The plurality of delayed clock signals ICLK1, ICLK2, ICLK3 and ICLK4, which are respectively outputted from the plurality of variable delay units 111, 112, 113 and 114, are outputted with phases that are delayed by the default delays of the corresponding variable delay units.

Next, referring to the timing diagram for the operation (b) of the clock generation circuit 100 after locking, the phase of the first delayed clock signal ICLK1 is controlled to be equal to the phase of the reference clock signal REFCLK. Therefore, the second delayed clock signal ICLK2, the third delayed clock signal ICLK3, and the fourth delayed clock signal ICLK4 are outputted by being controlled in their phases by the relative delays.

The delay locked loop in accordance with the present embodiment of the present invention can generate the output clock signal DLLCLK by selectively using the plurality of delayed clock signals which are outputted from the clock generation circuit 100 and which have various phases. Accordingly, even when the frequency of the external clock signal EXTCLK increases, the output clock signal DLLCLK having a desired phase can be stably generated.

Figure 5:
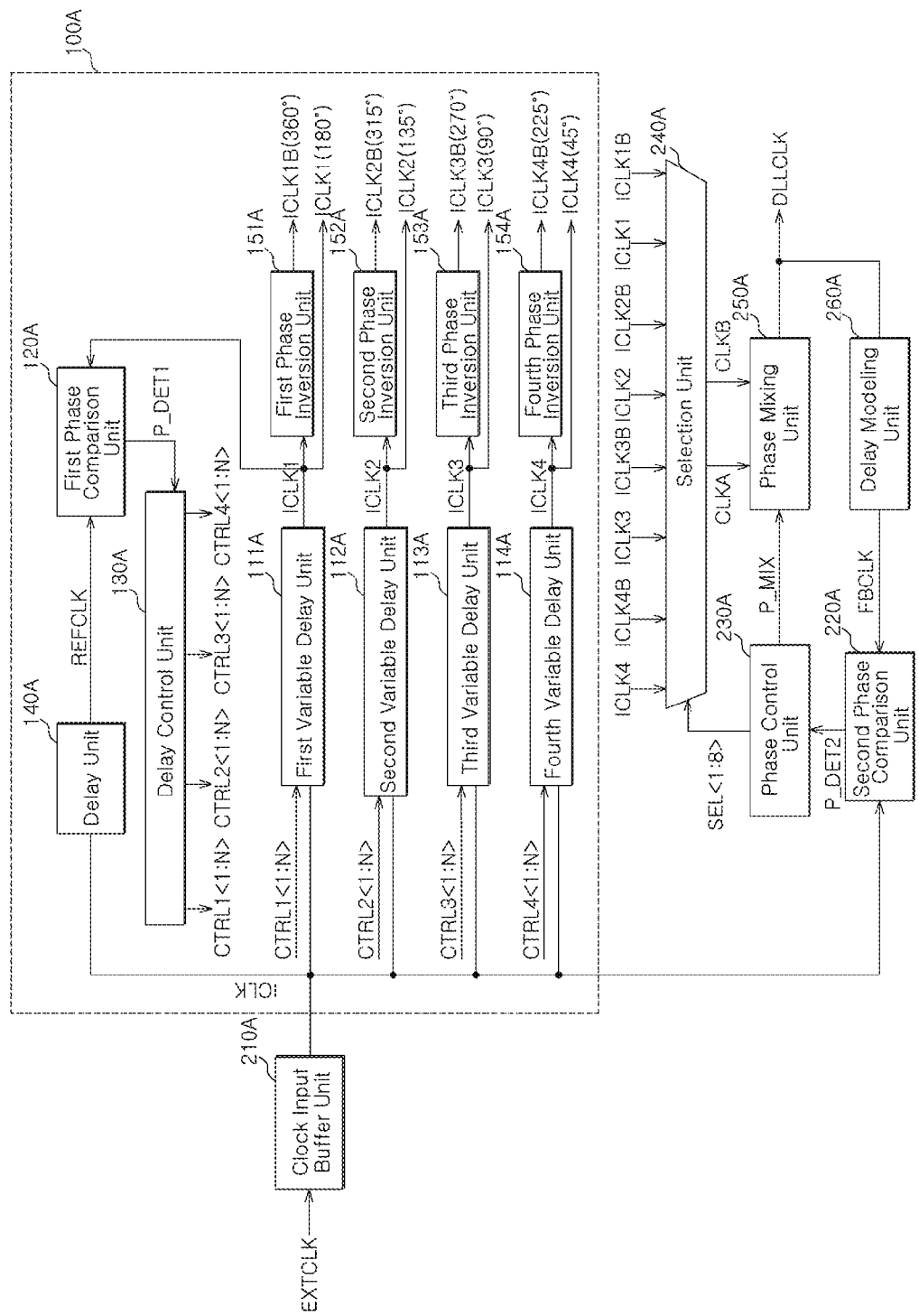
FIG. 5 is a configuration diagram illustrating an exemplary delay locked loop in accordance with a third embodiment of the present invention.

FIG. 5 is a configuration diagram illustrating a exemplary delay locked loop in accordance with a third embodiment of the present invention.

The delay locked loop in accordance with the present embodiment of the invention includes only a simplified configuration for the sake of clear description of the technical concept suggested.

Referring to FIG. 5, a delay locked loop includes a clock generation circuit 100A, a clock input buffer unit 210A, a second phase comparison unit 220A, a phase control unit 230A, a selection unit 240A, a phase mixing unit 250A, and a delay modeling unit 260A.

The detailed configuration and principal operations of the delay locked loop configured as mentioned above are described below.

The clock generation circuit 100A includes a plurality of variable delay units 111A, 112A, 113A and 114A, a first phase comparison unit 120A, a delay control unit 130A, a delay unit 140A, and phase inversion units 151A, 152A, 153A and 154A. For reference, the delay unit 140A and the phase inversion units 151A, 152A, 153A and 154A are component parts which can be selectively provided depending upon an embodiment.

The delay unit 140A is configured to delay an input clock signal ICLK and output a reference clock signal REFCLK. The reference clock signal REFCLK may be set as a signal which has a phase difference of one half cycle from the input clock signal ICLK. Of course, the delay of the delay unit 140A may be designed differently depending upon an embodiment.

The first phase comparison unit 120A is configured to compare the phase of the reference clock signal REFCLK, which has a predetermined phase difference from the input clock signal ICLK, and the phase of a delayed clock signal ICLK1, which is outputted from any one variable delay unit among the plurality of variable delay units 111A, 112A, 113A and 114A. In the present embodiment, the first phase comparison unit 120A compares the phase of the delayed clock signal ICLK1 outputted from a first variable delay unit 111A and the phase of the reference clock signal REFCLK, and outputs a first phase detection signal P_DET1. The first phase detection signal P_DET1 can be defined as a signal which has a voltage level or a pulse width corresponding to a phase difference between the two clock signals. In the present embodiment, the first phase comparison unit 120A locks the first phase detection signal P_DET1 when the phases of the delayed clock signal ICLK1 and the reference clock signal REFCLK become equal. For reference, while the reference clock signal REFCLK can be defined as a signal which is generated by delaying the input clock signal ICLK as described above, it is conceivable that the reference clock signal REFCLK may be defined as a clock signal which is externally supplied depending upon an embodiment.

The delay control unit 130A is configured to output a plurality of delay control codes CTRL1<1:N>, CTRL<1:N>, CTRL3<1:N> and CTRL4<1:N> by controlling the code values thereof according to a comparison result from the first phase comparison unit 120A. The code values of the plurality of delay control codes CTRL1<1:N>, CTRL<1:N>, CTRL3<1:N> and CTRL4<1:N> are set to have a predetermined differences of multiples. In other words, if the code value of the first delay control code CTRL1<1:N> is outputted to be smallest, the code value of the second delay control code CTRL<1:N> is outputted to be larger by a predetermined multiple of the code value of the first delay control code CTRL1<1:N>. The code value of the third delay control code CTRL3<1:N> is outputted to be larger by the predetermined multiple than the code value of the second delay control code CTRL<1:N>. The code value of the fourth delay control code CTRL4<1:N> is outputted to be larger by the predetermined multiple than the code value of the third delay control code CTRL3<1:N>. Namely, the delay control unit 130A generates the plurality of delay control codes CTRL1<1:N>, CTRL<1:N>, CTRL3<1:N> and CTRL4<1:N> such that the code values of the plurality of delay control codes CTRL1<1:N>, CTRL<1:N>, CTRL3<1:N> and CTRL4<1:N> have a predetermined is ratios of multiples. Of course, the delay control unit 130A controls the code values of the plurality of delay control codes CTRL1<1:N>, CTRL<1:N>, CTRL3<1:N> and CTRL4<1:N> under the control of the first phase detection signal P_DET1. That is to say, when assuming that the first phase detection signal P_DET1 is a signal which can be controlled in a pulse width, the code value of the first delay control code CTRL1<1:N> is controlled according to the pulse width of the first phase detection signal P_DET1, and the code values of the remaining delay control codes are controlled according to the predetermined difference between multiples. The delay control unit 130A may include a shift register.

The plurality of variable delay units 111A, 112A, 113A and 114A are configured to control the delays of the input clock signal ICLK according to the code values of delay control codes which are assigned respectively thereto among the plurality of delay control codes CTRL1<1:N>, CTRL2<1:N>, CTRL3<1:N> and CTRL4<1:N>, and respectively output a plurality of delayed clock signals ICLK1, ICLK2, ICLK3 and ICLK4. The delays of the plurality of variable delay units 111A, 112A, 113A and 114A increase as the code values of the delay control codes assigned thereto decrease, and decrease as the code values of the delay control codes assigned thereto increase. The plurality of variable delay units 111A, 112A, 113A and 114A have the same variable delay in correspondence to a change in the code values of the delay control codes. In the present embodiment, since the plurality of variable delay units 111A, 112A, 113A and 114A are is composed of the same elements, assuming that the delay control codes having the same code value are inputted to the plurality of variable delay units 111A, 112A, 113A and 114A, all the plurality of delayed clock signals ICLK1, ICLK2, ICLK3 and ICLK4, which are outputted respectively from the plurality of variable delay units 111A, 112A, 113A and 114A, have the same phase.

Meanwhile, as described above, the respective code values of the plurality of delay control codes CTRL1<1:N>, CTRL2<1:N>, CTRL3<1:N> and CTRL4<1:N> for controlling the delays of the plurality of variable delay units 111A, 112A, 113A and 114A are outputted with the predetermined differences of multiples. Accordingly, the plurality of delayed clock signals ICLK1, ICLK2, ICLK3 and ICLK4, which are outputted respectively from the plurality of variable delay units 111A, 112A, 113A and 114A, have different phases. In the present embodiment, when the phases of the first delayed clock signal ICLK1 outputted from the first variable delay unit 111A and the reference clock signal REFCLK are equal, the first phase detection signal P_DET1 is locked. Considering that the reference clock signal REFCLK is defined as a signal which has a phase difference of one half cycle from the input clock signal ICLK, the first delayed clock signal ICLK1 is also defined as a signal which has a phase difference of one half cycle, that is, 180°, from the input clock signal ICLK. The second delayed clock signal ICLK2, which is outputted from the second variable delay unit 112A, is defined as a signal which has a phase difference of 135° from the input clock signal ICLK. The third delayed clock signal ICLK3, which is outputted from the third variable delay unit 113A, is defined as a signal which has a phase difference of 90° from the input clock signal ICLK. The fourth delayed clock signal ICLK4, which is outputted from the fourth variable delay unit 114A, is defined as a signal which has a phase difference of 45° from the input clock signal ICLK.

The phase inversion units 151A, 152A, 153A and 154A output signals ICLK1B, ICLK2B, ICLK3B and ICLK4B, respectively, which are acquired by inverting the phases of the plurality of delayed clock signals ICLK1, ICLK2, ICLK3, ICLK4, respectively, outputted from the plurality of variable delay units 111A, 112A, 113A and 114A respectively. Hence, fifth through eighth delayed clock signals ICLK1B, ICLK2B, ICLK3B and ICLK4B, which respectively have phase differences of 360°, 315°, 270° and 225° from the input clock signal ICLK, are additionally generated.

The clock generation circuit 100A in accordance with the present embodiment of the invention can generate the plurality of delayed clock signals ICLK1, ICLK2, ICLK3, ICLK4, ICLK1B, ICLK2B, ICLK3B and ICLK4B which have different phases from the input clock signal ICLK. In the clock generation circuit 100A configured as mentioned above, the plurality of variable delay units 111A, 112A, 113A and 114A are internally arranged in parallel such that the input clock signal ICLK is delayed by relative delays. When generating each delayed clock signal, in such a scheme in which the plurality of variable delay units 111A, 112A, 113A and 114A are arranged in parallel, only the default delay of one variable delay unit, that is, the gate delay of the corresponding variable delay unit is reflected on the corresponding delayed clock signal. Therefore, even when the frequency of the input clock signal ICLK increases, the delayed clock signals having desired phases can be generated.

The principal operations of the delay locked loop shown in FIG. 5, which includes the above-described clock generation circuit 100A, are described below.

The clock input buffer unit 210A is configured to buffer an external clock signal EXTCLK and output the input clock signal ICLK.

The second phase comparison unit 220A is configured to compare the phases of the input clock signal ICLK and a feedback clock signal FBCLK and output a second phase detection signal P_DET2. That is to say, the second phase comparison unit 220A locks the second phase detection signal P_DET2 when the phases of the input clock signal ICLK and the feedback clock signal FBCLK are equal. The second phase detection signal P_DET2 can be defined as a signal which has a voltage level or a pulse width corresponding to a phase difference between the two clock signals.

The phase control unit 230A is configured to output clock select signals SEL<1:8> and a phase mixing signal P_MIX under the control of the second phase detection signal P_DET2.

The selection unit 240A is configured to output two delayed clock signals CLKA and CLKB which are selected from the plurality of delayed clock signals ICLK1, ICLK2, ICLK3, ICLK4, ICLK1B, ICLK2B, ICLK3B and ICLK4B by the clock select signals SEL<1:8>.

The phase mixing unit 250A is configured to mix the phases of the two delayed clock signals CLKA and CLKB, which are outputted from the selection unit 240A, under the control of the phase mixing signal P_MIX and output an output clock signal DLLCLK. The phase mixing unit 250A may be configured to control the phase weights of the two delayed clock signals CLKA and CLKB under the control of the phase mixing signal P_MIX. In general, the phase weights of the two delayed clock signals CLKA and CLKB are designed to be equal.

The delay modeling unit 260A is configured to delay the output clock signal DLLCLK by the model delay of a clock transfer path and output the feedback clock signal FBCLK. For reference, the model delay is determined by modeling the delay of the clock input buffer unit 210A, the delay of a signal line through which the output clock signal DLLCLK is transferred internally, and the delays of a repeater, etc.

The delay locked loop in accordance with the present embodiment of the present invention can generate the output clock signal DLLCLK by selectively using the plurality of delayed clock signals having various phases which are outputted from the clock generation circuit 100A. Accordingly, even when the frequency of the external clock signal EXT- CLK increases, the output clock signal DLLCLK having a desired phase can be stably generated.

Figure 6:
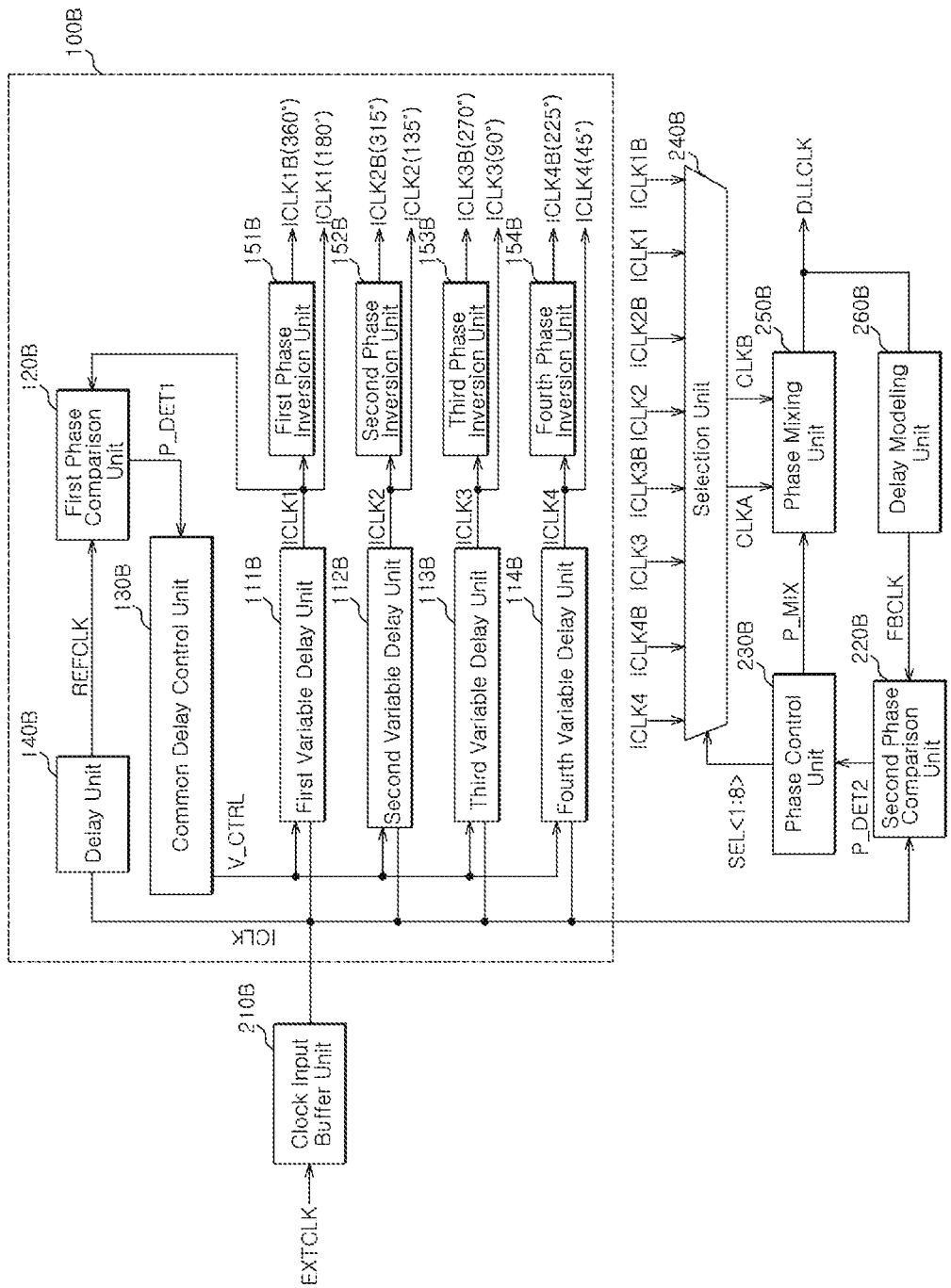
FIG. 6 is a configuration diagram illustrating an exemplary delay locked loop in accordance with a fourth embodiment of the present invention.

FIG. 6 is a configuration diagram illustrating an exemplary delay locked loop in accordance with a fourth embodiment of the is present invention.

The delay locked loop in accordance with the present embodiment of the invention includes only a simplified configuration for the sake of clear description of the technical concept suggested.

Referring to FIG. 6, a delay locked loop includes a clock generation circuit 100B, a clock input buffer unit 210B, a second phase comparison unit 220B, a phase control unit 230B, a selection unit 240B, a phase mixing unit 250B, and a delay modeling unit 260B.

The detailed configuration and principal operations of the delay locked loop configured as mentioned above are described below.

The clock generation circuit 100B includes a plurality of variable delay units 111B, 112B, 113B and 114B, a first phase comparison unit 120B, a common delay control unit 130B, a delay unit 140B, and phase inversion units 151B, 152B, 153B and 154B. For reference, the delay unit 140B and the phase inversion units 151B, 152B, 153B and 154B are component parts which can be selectively provided depending upon an embodiment.

The delay unit 140B is configured to delay an input clock signal ICLK and output a reference clock signal REFCLK. The reference clock signal REFCLK may be set as a signal which has a phase difference of one half cycle from the input clock signal ICLK. Of course, the delay of the delay unit 140B may be designed differently depending upon an embodiment.

The first phase comparison unit 120B is configured to compare the phase of the reference clock signal REFCLK, which has a predetermined phase difference from the input clock signal ICLK, and the phase of a delayed clock signal ICLK1, which is outputted from any one variable delay unit among the plurality of variable delay units 111B, 112B, 113B and 114B. In the present embodiment, the first phase comparison unit 120B compares the phase of the delayed clock signal ICLK1 outputted from a first variable delay unit 111B and the phase of the reference clock signal REFCLK, and outputs a first phase detection signal P_DET1. The first phase detection signal P_DET1 can be defined as a signal which has a voltage level or a pulse width corresponding to a phase difference between the two clock signals. In the present embodiment, the first phase comparison unit 120B locks the first phase detection signal P_DET1 when the phases of the delayed clock signal ICLK1 and the reference clock signal REFCLK become equal. For reference, while the reference clock signal REFCLK can be defined as a signal which is generated by delaying the input clock signal ICLK as described above, it is conceivable depending upon an embodiment that the reference clock signal REFCLK may be defined as a clock signal which is externally supplied.

The common delay control unit 130B is configured to output a common delay control signal V_CTRL which is controlled in the voltage level thereof under the control of a comparison result from the first phase comparison unit 120B, that is, the first phase detection signal P_DET1. In general, the common delay control unit 130B can include a plurality of voltage dropping elements and a plurality of switching elements. The common delay control unit 130B outputs any one divided voltage among a plurality of divided voltages, as the common delay control signal V_CTRL under the control of the first phase detection signal P_DET1.

The plurality of variable delay units 111B, 112B, 113B and 114B are configured to control the delays of the input clock signal ICLK according to the voltage level of the common delay control signal V_CTRL, and respectively output a plurality of delayed clock signals ICLK1, ICLK2, ICLK3 and ICLK4. The plurality of variable delay units 111B, 112B, 113B and 114B have different variable delays in correspondence to a change in the voltage level of the common delay control signal V_CTRL. The delays of the plurality of variable delay units 111B, 112B, 113B and 114B increase as the voltage level of the common delay control signal V_CTRL decrease, and decrease as the voltage level of the common delay control code V_CTRL increase. In the present embodiment, since the plurality of variable delay units 111B, 112B, 113B and 114B are composed of elements which have different delay characteristics, even though the common delay control signal V_CTRL of the same voltage level is inputted to the plurality of variable delay units 111B, 112B, 113B and 114B, all the plurality of delayed clock signals ICLK1, ICLK2, ICLK3 and ICLK4, which are respectively outputted from the plurality of variable delay units 111B, 112B, 113B and 114B, have different phases. The delays of the plurality of variable delay units 111B, 112B, 113B and 114B may be designed such that a predetermined multiple is maintained therebetween.

In the present embodiment, when the phases of the first delayed clock signal ICLK1 outputted from the first variable delay unit 111B and the reference clock signal REFCLK are equal, the first phase detection signal P_DET1 is locked. Accordingly, considering that the reference clock signal REFCLK is defined as a signal which has a phase difference of one half cycle from the input clock signal ICLK, the first delayed clock signal ICLK1 is also defined as a signal which has a phase difference of one half cycle, that is, 180°, from the input clock signal ICLK. The second delayed clock signal ICLK2, which is outputted from the second variable delay unit 112B, is defined as a signal which has a phase difference of 135° from the input clock signal ICLK. The third delayed clock signal ICLK3, which is outputted from the third variable delay unit 113B, is defined as a signal which has a phase difference of 90° from the input clock signal ICLK. The fourth delayed clock signal ICLK4, which is outputted from the fourth variable delay unit 114B, is defined as a signal which has a phase difference of 45° from the input clock signal ICLK.

The phase inversion units 151B, 152B, 153B and 154B output signals ICLK1B, ICLK2B, ICLK3B and ICLK4B, respectively, which are acquired by respectively inverting the phases of the plurality of delayed clock signals ICLK1, ICLK2, ICLK3, ICLK4 outputted respectively from the plurality of variable delay units 111B, 112B, 113B and 114B. Hence, fifth through eighth delayed clock signals ICLK1B, ICLK2B, ICLK3B and ICLK4B, which respectively have phase differences of 360°, 315°, 270° and 225° from the input clock signal ICLK, are additionally generated.

The clock generation circuit 100B in accordance with the present embodiment of the invention can generate the plurality of delayed clock signals ICLK1, ICLK2, ICLK3, ICLK4, ICLK1B, ICLK2B, ICLK3B and ICLK4B which have different phases from the input clock signal ICLK. In the clock generation circuit 100B configured as mentioned above, the plurality of variable delay units 111B, 112B, 113B and 114B are internally arranged in parallel such that the input clock signal ICLK is delayed by relative delays. When generating each delayed clock signal, in such a scheme in which the plurality of variable delay units 111B, 112B, 113B and 114B are arranged in parallel, only the default delay of one variable delay unit, that is, the gate delay of the corresponding variable delay unit is reflected on the corresponding delayed clock signal. Therefore, even when the frequency of the input clock signal ICLK increases, the delayed clock signals having desired phases may be generated.

The principal operations of the delay locked loop shown in FIG. 6, which includes the above-described clock generation circuit 100B, are described below.

The clock input buffer unit 210B is configured to buffer an external clock signal EXTCLK and output the input clock signal ICLK.

The second phase comparison unit 220B is configured to compare the phases of the input clock signal ICLK and a feedback clock signal FBCLK and output a second phase detection signal P_DET2. That is to say, the second phase comparison unit 220B locks the second phase detection signal P_DET2 when the phases of the input clock signal ICLK and the feedback clock signal FBCLK are equal. The second phase detection signal P_DET2 can be defined as a signal which has a voltage level or a pulse width corresponding to a phase difference between the two clock signals.

The phase control unit 230B is configured to output clock select signals SEL<1:8> and a phase mixing signal P_MIX under the control of the second phase detection signal P_DET2.

The selection unit 240B is configured to output two delayed clock signals CLKA and CLKB which are selected from the plurality of delayed clock signals ICLK1, ICLK2, ICLK3, ICLK4, ICLK1B, ICLK2B, ICLK3B and ICLK4B by the clock select signals SEL<1:8>.

The phase mixing unit 250B is configured to mix, under the control of the phase mixing signal P MIX, the phases of the two delayed clock signals CLKA and CLKB, which are outputted from the selection unit 240B and output an output clock signal DLLCLK. The phase mixing unit 250B may be configured to control the phase weights of the two delayed clock signals CLKA and CLKB under the control of the phase mixing signal P_MIX. In general, the phase weights of the two delayed clock signals CLKA and CLKB are designed to be the same with each other.

The delay modeling unit 260B is configured to delay the output clock signal DLLCLK by the model delay of a clock transfer path and output the feedback clock signal FBCLK. For reference, the model delay is determined by modeling the delay of the clock input buffer unit 210B, the delay of a signal line through which the output clock signal DLLCLK is transferred internally, and the delays of a repeater, etc.

The delay locked loop in accordance with the present embodiment of the present invention can generate the output clock signal DLLCLK by selectively using the plurality of delayed clock signals having various phases which are outputted from the clock generation circuit 100B. Accordingly, even when the frequency of the external clock signal EXTCLK increases, the output clock signal DLLCLK having a desired phase can be stably generated.

Figure 7:
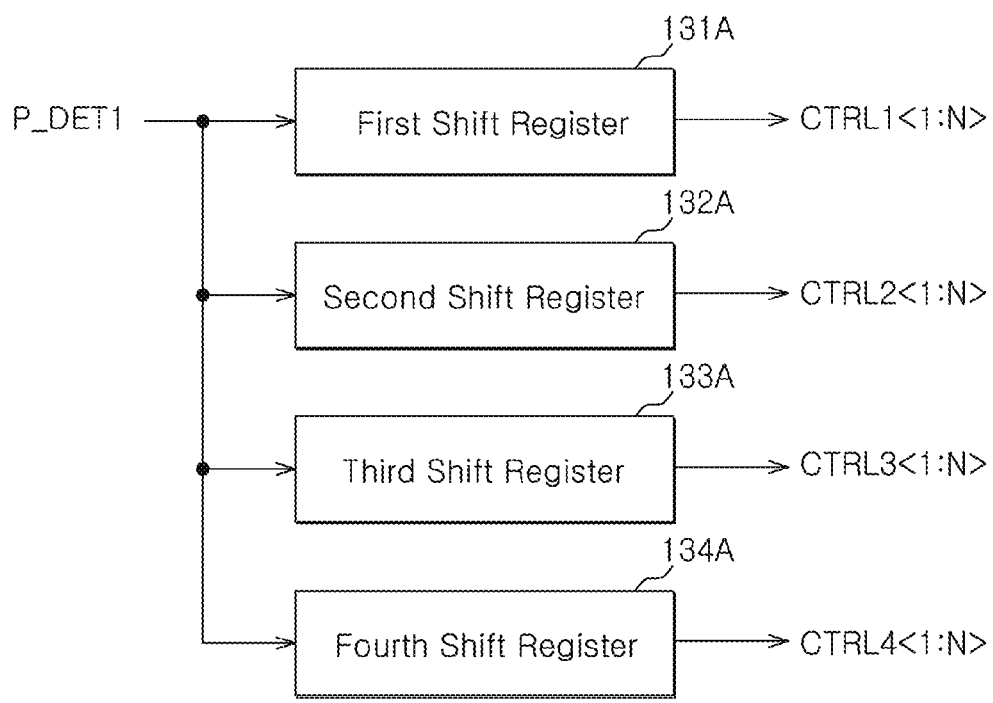
FIG. 7 is a configuration diagram illustrating an exemplary embodiment of the delay control unit shown in FIG. 5.

FIG. 7 is a configuration diagram illustrating an exemplary embodiment of the delay control unit shown in FIG. 5.

Referring to FIG. 7, the delay control unit 130A is composed of a plurality of shift registers 131A through 134A. The plurality of shift registers 131A through 134A perform shift right or shift left operations under the control of the first phase detection signal P_DET1, and respectively output the plurality of delay control codes CTRL1<1:N>, CTRL2<1:N>, CTRL3<1:N> and CTRL4<1:N> which have different code values. The initial code values of the plurality of shift registers 131A through 134A may be set to have predetermined differences of multiples therebetween.

As is apparent from the above descriptions, the clock generation circuit in accordance with the embodiments of the present invention can generate clock signals which have various phases. Also, the delay locked loop in accordance with the embodiments of the is present invention can generate a stable DLL clock signal using an external clock signal with a high frequency.

So far, embodiments of the present invention have been described in detail. For reference, embodiments including additional component elements, which are not directly associated with the technical concept of the present invention, may be exemplified in order to describe the present invention in further detail. In particular, the number of variable delay units may vary depending upon a phase range to be controlled according to an embodiment. Since such embodiment changes have a large number of cases and can be easily inferred by those skilled in the art, the enumeration thereof will be omitted herein.

While certain embodiments have been described above, it will be understood to those skilled in the art that the embodiments described are by way of example only. Accordingly, the clock generation circuit and the delay locked loop using the same described herein should not be limited based on the described embodiments. Rather, the clock generation circuit and the delay locked loop using the same described herein should only be limited in light of the claims that follow when taken in conjunction with the above description and accompanying drawings.

What is claimed is:

1. A clock generation circuit comprising:
   a plurality of variable delay units, each unit configured to control a delay of an input clock signal under the control of delay control signals assigned respectively thereto among a plurality of delay control signals, and output a plurality of delayed clock signals;
   a phase comparison unit configured to compare a phase of a reference clock signal which has a predetermined phase difference from the input clock signal and a phase of a delayed clock signal which is outputted from any one variable delay unit among the plurality of variable delay units; and
   a delay control unit configured to generate the plurality of delay control signals based on a comparison result from the phase comparison unit,
   wherein each of the plurality of delay control signals has different voltage levels according to the comparison result from the phase comparison unit, and the voltage levels of the plurality of delay control signals have a predetermined differences of multiples therebetween.

2. The clock generation circuit according to claim 1, wherein the plurality of variable delay units have the same variable delay in correspondence to changes in the voltage levels of the delay control signals.

3. The clock generation circuit according to claim 1, wherein the plurality of delay control signals are generated as digital codes, which have different code values, according to the comparison result from the phase comparison unit, and the code values of the plurality of delay control signals have a predetermined differences of multiples therebetween.

4. The clock generation circuit according to claim 3, wherein the plurality of variable delay units have the same variable delay in correspondence to changes in the code values of the delay control signals.

5. The clock generation circuit according to claim 1, further comprising:

phase inversion units configured to output signals which are acquired by inverting phases of the plurality of delayed clock signals outputted from the plurality of variable delay units.

6. The clock generation circuit according to claim 1, further comprising:
a delay unit configured to delay the input clock signal and output a reference clock signal.

7. The clock generation circuit according to claim 1, wherein the reference clock signal is a signal which has a phase difference of one half cycle from the input clock signal.

8. A delay locked loop comprising:
a plurality of variable delay units configured to control a delay of an input clock signal under the control of delay control signals assigned thereto among a plurality of delay control signals, and output a plurality of delayed clock signals;
a first phase comparison unit configured to compare a phase of a reference clock signal which has a predetermined phase difference from the input clock signal and a phase of a delayed clock signal which is outputted from any one variable delay unit among the plurality of variable delay units;
a delay control unit configured to generate the plurality of delay control signals based on a comparison result from the first phase comparison unit;
a second phase comparison unit configured to compare phases of the input clock signal and a feedback clock signal and output a phase detection signal;
a phase control unit configured to output clock select signals and a phase mixing signal under the control of the phase detection signal;
a selection unit configured to output first and second delayed control signals which are selected among the plurality of delayed clock signals by the clock select signals;
a phase mixing unit configured to mix phases of the first and second delayed clock signals, which are outputted from the selection unit, under the control of the phase mixing signal, and output an output clock signal; and
a delay modeling unit configured to delay the output clock signal by a model delay of a clock transfer path and output the feedback clock signal.

9. The delay locked loop according to claim 8, wherein the plurality of delay control signals have different voltage levels according to the comparison result from the first phase comparison unit, and the voltage levels of the plurality of delay control signals have a predetermined number of times therebetween.

10. The delay locked loop according to claim 9, wherein the plurality of variable delay units have the same variable delay in correspondence to changes in the voltage levels of the delay control signals.

11. The delay locked loop according to claim 8, wherein the plurality of delay control signals are generated as digital codes, which have different code values, according to the comparison result from the first phase comparison unit, and the code values of the plurality of delay control signals have a predetermined number of times therebetween.

12. The delay locked loop according to claim 11, wherein the plurality of variable delay units have the same variable delay in correspondence to changes in the code values of the delay control signals.

13. The delay locked loop according to claim 8, further comprising: a clock input buffer unit configured to buffer an external clock signal and output the input clock signal.

14. The delay locked loop according to claim 8, further comprising: phase inversion units configured to supply signals, which are acquired by inverting phases of the plurality of delayed clock signals outputted from the plurality of variable delay units, to the selection unit.

15. The delay locked loop according to claim 8, further comprising: a delay unit configured to delay the input clock signal and output a reference clock signal.

16. The delay locked loop according to claim 8, wherein the reference clock signal is a signal which has a phase difference of one half cycle from the input clock signal.

17. A delay locked loop comprising:
a plurality of variable delay units configured to control a delay of an input clock signal according to a voltage level of a common delay control signal, and output a plurality of delayed clock signals;
a first phase comparison unit configured to compare a phase of a reference clock signal which has a predetermined phase difference from the input clock signal and a phase of a delayed clock signal which is outputted from any one variable delay unit among the plurality of variable delay units;
a common delay control unit configured to output the common delay control signal which is controlled in the voltage level thereof according to a comparison result from the first phase comparison unit;
a second phase comparison unit configured to compare phases of the input clock signal and a feedback clock signal and output a phase detection signal;
a phase control unit configured to output clock select signals and a phase mixing signal under the control of the phase detection signal;
a selection unit configured to output first and second delayed control signals which are selected among the plurality of delayed clock signals by the clock select signals;
a phase mixing unit configured to mix phases of the first and second delayed clock signals, which are outputted from the selection unit, under the control of the phase mixing signal, and output an output clock signal; and
a delay modeling unit configured to delay the output clock signal by a model delay of a clock transfer path and output the feedback clock signal,
wherein the plurality of variable delay units have different variable delays in correspondence to a change in the voltage level of the common delay control signal.

18. The delay locked loop according to claim 17, wherein delays of the plurality of variable delay units have a predetermined number of times therebetween.

19. The delay locked loop according to claim 17, further comprising:
a clock input buffer unit configured to buffer an external clock signal and output the input clock signal.

20. The delay locked loop according to claim 17, further comprising:
phase inversion units configured to supply signals, which are acquired by inverting phases of the plurality of delayed clock signals outputted from the plurality of variable delay units, to the selection unit.

21. The delay locked loop according to claim 17, further comprising: a delay unit configured to delay the input clock signal and output a reference clock signal.

22. The delay locked loop according to claim 17, wherein the reference clock signal is a signal which has a phase difference of one half cycle from the input clock signal.

* * * * *